(12) United States Patent
Bellini et al.

(10) Patent No.: US 12,501,668 B2
(45) Date of Patent: Dec. 16, 2025

(54) POWER SEMICONDUCTOR DEVICE AND A METHOD FOR PRODUCING A POWER SEMICONDUCTOR DEVICE

(71) Applicant: Hitachi Energy Ltd, Zürich (CH)

(72) Inventors: Marco Bellini, Zürich (CH); Lars Knoll, Hägglingen (CH); Gianpaolo Romano, Baden (CH); Yulieth Arango, Zürich (CH)

(73) Assignee: HITACHI ENERGY LTD, Zürich (CH)

( * ) Notice: Subject to any disclaimer, the term of this patent is extended or adjusted under 35 U.S.C. 154(b) by 297 days.

(21) Appl. No.: 18/039,920

(22) PCT Filed: Dec. 1, 2021

(86) PCT No.: PCT/EP2021/083791
§ 371 (c)(1),
(2) Date: Jun. 1, 2023

(87) PCT Pub. No.: WO2022/117656
PCT Pub. Date: Jun. 9, 2022

(65) Prior Publication Data
US 2024/0096937 A1     Mar. 21, 2024

(30) Foreign Application Priority Data
Dec. 3, 2020  (EP) ..................... 20211565

(51) Int. Cl.
*H10D 62/10*     (2025.01)
*H01L 21/04*     (2006.01)
(Continued)

(52) U.S. Cl.
CPC ......... *H10D 62/111* (2025.01); *H01L 21/046* (2013.01); *H10D 12/031* (2025.01);
(Continued)

(58) Field of Classification Search
CPC ............. H10D 64/647; H10D 62/8325; H10D 62/111; H10D 62/109; H10D 62/393; H10D 12/031; H10D 12/441; H01L 21/046
See application file for complete search history.

(56) References Cited

U.S. PATENT DOCUMENTS

| 5,962,893 A | 10/1999 | Omura et al. |
| 6,091,108 A | 7/2000 | Harris et al. |

(Continued)

FOREIGN PATENT DOCUMENTS

| EP | 0348916 A2 | 1/1990 | |
| EP | 3255676 A1 * | 12/2017 | ........... H10D 62/145 |

*Primary Examiner* — Christine S. Kim
*Assistant Examiner* — Andrew Victor Prostor
(74) *Attorney, Agent, or Firm* — Procopio, Cory, Hargreaves & Savitch LLP (57) ABSTRACT

A power semiconductor device and method for production thereof is specified involving an electrode, a base layer of a first conductivity type provided on the electrode, at least one contact layer provided on the base layer, a gate contact provided on the base layer and on the at least one contact layer, an insulation layer between the gate contact and the base layer and between the at least one contact layer and the gate contact, and at least one zone of a second conductivity type within the base layer, wherein the at least one zone is constructed and arranged to shift away a peak electric field generated in the base layer from the insulation layer between the gate contact and the base layer.

10 Claims, 8 Drawing Sheets

(51) Int. Cl.
    *H10D 12/00*     (2025.01)
    *H10D 12/01*     (2025.01)
    *H10D 30/66*     (2025.01)
    *H10D 62/17*     (2025.01)
    *H10D 62/832*     (2025.01)

(52) U.S. Cl.
    CPC ........... *H10D 12/441* (2025.01); *H10D 30/66* (2025.01); *H10D 62/393* (2025.01); *H10D 62/8325* (2025.01)

(56) References Cited

U.S. PATENT DOCUMENTS

| | | | |
|---|---|---|---|
| 6,979,863 B2 | 12/2005 | Ryu | |
| 11,056,586 B2 * | 7/2021 | Arthur | H10D 62/154 |
| 2014/0183553 A1 | 7/2014 | Zhang et al. | |
| 2018/0261666 A1 * | 9/2018 | Zeng | H10D 64/518 |
| 2018/0308938 A1 | 10/2018 | Siemieniec et al. | |

* cited by examiner

POWER SEMICONDUCTOR DEVICE AND A METHOD FOR PRODUCING A POWER SEMICONDUCTOR DEVICE

CROSS-REFERENCE TO RELATED APPLICATIONS

This application is U.S. National Stage of Internal Patent Application PCT/EP2021/083791, filed Dec. 1, 2021, which claims priority to European Patent Application No. 20211565.5, filed Dec. 3, 2020, the contents of which is incorporated herein by reference.

The invention relates to a power semiconductor device and a method for producing a power semiconductor device.

A large number of systems and applications benefit from modern power semiconductor devices with Schottky contacts, so called Schottky power semiconductor devices, e.g. metal oxide semiconductor field effect transistor (MOSFET) devices or insulated-gate bipolar transistor (IGBT) devices, offering excellent overall performance both for static and dynamic electrical parameters.

For example, Schottky MOSFET devices do not feature doped contact regions or well regions, e.g. n+ doped contacts or p+ doped wells. This is to say that such Schottky power semiconductor devices do not have a metallurgical junction to protect a gate oxide.

It is an object of the invention to provide a power semiconductor device, which has an improved reliability and to provide a method for producing such a power semiconductor device.

The object is achieved by the subject matter of the independent claims. Further, embodiments are evident from the dependent claims and the following description.

A first aspect of the invention relates to a power semiconductor device. The power semiconductor device is, for example a power MOSFET or a power IGBT. Further, the power semiconductor device is, for example, a Schottky power semiconductor device.

The power semiconductor device is based, for example, on silicon carbide. This is to say that the power semiconductor device is, for example, either a SiC power MOSFET or a SiC power IGBT.

According to the embodiment of the first aspect, the power semiconductor device comprises an electrode. The electrode can comprise, for example a metal or consists of a metal. For example, the electrode is, for example, an electrode being externally contactable in an electrical conductive manner.

The electrode has, for example, a main plain of extension. Lateral directions are aligned parallel to the main plain of extension, and a vertical direction is aligned perpendicular to the main plain of extension.

According to the embodiment, the power semiconductor device comprises a base layer of a first conductivity type provided on the electrode. The base layer, for example, comprises a semiconductor material or consists of a semiconductor material. Exemplarily, the base layer is an epitaxial base layer. The base layer comprises Silicon Carbide (SiC), for example. Silicon carbide is a chemical compound of silicon and carbon belonging to the group of carbides. Silicon carbide is a polytype material, wherein some polytypes have a band gap of up to 3.33 eV, such as 2H—SiC, making SiC a semiconductor with a wide band gap.

The base layer comprises, for example n-type dopants such that the first conductivity type is an n-type conductivity. A doping concentration of the first dopants of the base layer can be homogeneous. Alternatively, the doping concentration can increase towards the electrode or the doping concentration has a region of higher doping concentration at the electrode.

The base layer is, for example, in direct contact to the electrode or if between the base layer and the electrode no layer of a second conductivity type is provided, the power semiconductor device is a power MOSFET.

Alternatively, an injecting layer of the second conductivity type is provided on the base layer. For example, the injecting layer is arranged between the base layer and the electrode. In this case, the power semiconductor device is, for example, a power IGBT.

For example, the injecting layer comprises p-type dopants such that the second conductivity type is a p-type conductivity. Alternatively, the first conductivity type and the second conductivity type can be inversed.

According to the embodiment, the power semiconductor device comprises at least one contact layer provided on the base layer. The contact layer is arranged on a top surface of the base layer, facing away from the electrode, for example. The contact layer has, for example a main extension direction in lateral directions. The contact layer is, for example, externally contactable in an electrical conductive manner.

Furthermore, it is possible that at least two contact layers are provided on the base layer. In this case, the contact layers are spaced apart from one another. The main extension directions of the contact layers, for example, extend parallel to one another. One of the at least two contact layers is formed, e.g., as a source of the power MOSFET and the other one of the at least two contact layers is formed, e.g., as a drain of the power MOSFET.

According to the embodiment, the power semiconductor device comprises a gate contact provided on the base layer and on the contact layer. The gate contact has a main extension direction being parallel to the lateral directions, for example. The main extension direction of the gate contact extends, for example, perpendicular to the main extension directions of the contact layer.

The gate contact comprises or consists of at least one of a metal and polysilicon, for example. Further, the gate contact is, at least in regions, externally contactable in an electrical conductive manner.

According to the embodiment, the power semiconductor device comprises an insulation layer between the gate contact and the base layer and between the contact layer and the gate contact. For example, the gate layer is embedded in the insulation layer. This is to say that the insulation layer covers all outer surfaces of the gate contact, except the region for externally contacting.

The insulation layer comprises, for example, a dielectric material. The insulation layer is a gate oxide, for example. E.g. the insulation layer includes high K dielectric stacks.

In this case, the k dielectric stacks comprise or consist of materials with a higher relative permittivity than silicon dioxide, so-called high-K materials.

According to the embodiment, the power semiconductor device comprises at least one zone of a second conductivity type different from the first conductivity type within the base layer. The zone is, for example, embedded within the base layer. In this context, embedded can mean that a top surface, a bottom surface and at least two side surfaces of the zone is covered by the base layer. It is further possible, that embedded means that an outer surface of the zone is completely covered by the base layer, e.g., the zone is completely enclosed by the base layer in a three dimensional manner. The zone can have a triangular, a squared, a rectangular, a round, an oval or an elliptic form in a cross section along one of the lateral directions and the vertical direction.

The zone comprises, for example p-type dopants such that the second conductivity type is a p-type conductivity. Alternatively, the zone comprises n-type dopants such that the second conductivity type is an n-type conductivity. For example, the second conductivity type is different from the first conductivity type. This is to say if the base layer comprises n-type dopants the zone comprises p-type dopants and vice versa.

According to the embodiment of the power semiconductor device, the at least one zone is constructed and arranged to shift away a peak electric field generated in the base layer from the insulation layer between the gate contact and the base layer.

The peak electric field is an electrical field, which, for example, at least one of temporarily and locally strongly increases or decreases. For example, such electric field is, for example, a combination of two exponential parts, one exponentially increasing part and another exponentially decreasing part.

For example, the at least one zone of the second conductivity type is shaped and arranged such that the zone shifts away the peak electric field produced in the base layer from the interface between the insulation layer of the gate contact and a region of the base layer facing the gate contact.

According to at least one embodiment of the power semiconductor device, the at least one contact layer is a metallic layer. Exemplarily, the metallic layers comprise a metal or consist of a metal.

An interface between the metallic layer and the base layer forms, for example, a Schottky contact. A material composition, such as a doping concentration of the base layer and a work function of the metallic layer, is selected such that a depletion zone is formed in a region of the interface within the base layer.

Alternatively, the at least one contact layer comprises or consists of a semiconductor material having a first region of the first conductivity and a second region of the second conductivity. In this case the first region is configured for external contacting. The second region is arranged between the first region and the drift layer.

According to at least one embodiment of the power semiconductor device, the base layer comprises a plain top surface and the at least one metallic layer does not extend into the base layer in vertical direction. For example, the top surface faces away from the electrode. This is to say that the metallic layer and the base layer do not overlap with one another in vertical direction. In this way, the contact does not require expensive implantation and activation steps.

According to at least one embodiment of the power semiconductor device, the base layer comprises at least one recessed top surface and the at least one contact layer is provided on the at least one recessed top surface.

For example, the base layer comprises a bar structure facing away from the electrode. The bar structure comprises a top surface and at least one side surface. The side surface connects the top surface of the bar structure with the recessed top surface of the base layer. The bar structure extends, exemplarily along a main extension direction in lateral directions being perpendicular to the main extension direction of the gate contact. Further, the bar structure is arranged in a central position of the base layer.

E.g. the bar structure and the base layer are formed in one piece. This is to say that the bar structure is a part of the base layer. According to this embodiment, the contact layer and the base layer overlap with one another in vertical direction.

According to at least one embodiment of the power semiconductor device, at least one of the gate contact and the insulation layer partially overlaps with the at least one contact layer in lateral directions.

According to at least one embodiment of the power semiconductor device, an overlap of the at least one of the gate contact and the insulation layer in lateral directions with the at least one contact layer is between at least 0.001 µm and at most 3 µm. For example, the overlap of the at least one of the gate contact and the insulation layer in lateral directions with the at least one contact layer is between at least 0.2 µm and at most 2 µm.

According to at least one embodiment of the power semiconductor device, the at least one zone is provided centred in lateral directions with respect to the gate contact. For example, if the power semiconductor device comprises at least two contact layers, the zone is arranged centred between the contact layers in lateral directions. If there is only a single zone, the zone has equal distances to the contact layers in lateral directions.

A centred arrangement of the zone, exemplarily improves the controllability of the electric field within the base layer such that the electric field can then extend symmetrically within the base layer.

According to at least one embodiment of the power semiconductor device, the at least one zone has a main extension direction in lateral directions transverse to a main extension direction of the base layer in lateral directions. Exemplarily, the main extension direction of the zone is perpendicular to the main extension direction of the base layer in lateral directions.

According to at least one embodiment of the power semiconductor device, the at least one zone has a length in lateral directions being equal to the length of the at least one contact layer. The length of the at least one zone is, for example, an extend of the zone in lateral directions along the main extension direction of the zone. The length of the contact layer is, for example, an extend of the contact layer in lateral directions along the main extension direction of the contact layer. E.g. the main extension direction of the contact layers is parallel to the main extension direction of the zone.

In addition or alternatively, the length of the zone is equal to a width of at least one of the gate contact and the insulation layer, for example. The width of at least one of the gate contact and the insulation layer is, for example, an extend of at least one of the gate contact and the insulation layer in lateral directions perpendicular to the main extension direction of at least one of the gate contact and the insulation layer.

Due to such dimensions of the zone, the device can have an improved resistance such that the resistance of the device is sufficiently low.

According to at least one embodiment of the power semiconductor device, a distance between the zone and the insulation layer is at most 1 µm. The distance is the minimal distance in vertical direction between the zone and the insulation layer. It is possible that the zone and the insulation layer can be in direct contact with one another.

Further, the distance between the zone and the insulation layer is at most 0.25 µm, for example.

Due to such distances the electric field is sufficiently low within the base layer in regions of the insulation layer. At the same time, a production effort of the zone is reduced having the distance of at most 0.25 µm. Thus, a quality of the base layer is maintained. However, in case of using a zone having the distance of at most 1 µm current spreading is improved, as the current can spread more evenly.

According to at least one embodiment of the power semiconductor device, the at least one zone comprises a peak doping concentration being at least $10^{15}$ 1/cm$^3$ and at most $5 \times 10^{17}$ 1/cm$^3$. For example, a doping concentration of the zone has a maximum value being the peak doping concentration value within the zone.

According to at least one embodiment of the power semiconductor device, the at least one zone comprises a peak doping concentration being one to hundred times higher than a peak doping concentration of the base layer.

According to at least one embodiment of the power semiconductor device, a thickness of the at least one zone is at least 0.1 µm and at most 1 µm. The thickness is the minimal extension in vertical direction of the zone. Further, the thickness of the zone is, for example at least 0.2 µm and at most 0.6 µm.

According to at least one embodiment of the power semiconductor device, the at least one zone has a width in lateral directions along a main extension direction of the base layer, which is less than 40% of a length of the gate contact in lateral directions along the main extension direction of the base layer. The main extension direction of the base layer equals a main extension direction of the gate contact. If the zone has a width being larger than 40% of the length of the gate contact, a current flow through the base layer is hindered and significantly increase an on-state resistance. Due to such a width of less than 40%, the on-state resistance increase is negligible.

According to at least one embodiment, the power semiconductor device comprises at least two zones of the second conductivity type, wherein the at least two zones are provided in a common plane extending in lateral directions.

According to at least one embodiment, the power semiconductor device comprises at least three zones of the second conductivity type.

According to at least one embodiment of the power semiconductor device, the at least three zones form a retrograde profile in a cross sectional view perpendicular to lateral directions. The retrograde profile is a doping profile, wherein a peak doping concentration of the doping profile faces away from the contact layer.

According to at least one embodiment of the power semiconductor device, a peak doping concentration of the retrograde profile faces away from the gate contact. For example, if the power semiconductor device comprises the at least two contact layers, the peak is located in the centre between the contact layers. E.g. a zone in a region of the peak is arranged further away from the gate contact in vertical direction than a zone in regions not located at the peak. For example, the zones not located at the peak are arranged symmetrically around the zone in the region of the peak.

For example, the zones can be arranged on grid points of a regular grid. The grid, for example, is a triangular, rectangular or hexagonal grid.

Due to the arrangement of the zones according to the retrograde profile, the current can spread more evenly.

For example, a so-called a dead zone for the current is located around each zone. Due to diffusion, such a dead zone is, e.g., smaller than the respective zone. Thus, a plurality of zones being smaller than a single zone can spread the current better than the single zone being larger than the plurality of zones.

A second aspect of the invention relates to a method for producing a power semiconductor device. Preferably the method produces a power semiconductor device described herein above. All features disclosed in connection with the power semiconductor device are therefore also disclosed in connection with the method and vice versa.

According to the embodiment of the second aspect of the method, an electrode is provided.

According to the embodiment of the method, a base layer of a first conductivity type is provided on the electrode.

According to the embodiment of the method, at least one contact layer is applied on the base layer.

According to the embodiment of the method, a gate contact and an insulation layer are applied on the base layer and at least one contact layer, wherein the insulation layer is applied between the gate contact and the base layer and between the at least one contact layer and the gate contact.

According to the embodiment of the method, at least one zone of a second conductivity type is generated within the base layer, wherein the at least one zone is constructed and arranged to shift away a peak electric field generated in the base layer from the insulation layer between the gate contact and the base layer. For example, the zone is generated by implanting dopants of the second conductivity type within the base layer. Subsequently, a material of the base layer is grown on top of the generated zone and the adjacent base layer, for example. Due to such an overgrowth process, the zone can be embedded within the base layer.

The subject matter of the invention will be explained in more detail in the following with reference to exemplary embodiments which are illustrated in the attached drawings.

The reference symbols used in the drawings, and their meanings, are listed in summary form in the list of reference symbols. In principle, identical parts are provided with the same reference symbols in the figures.

Figure 1:
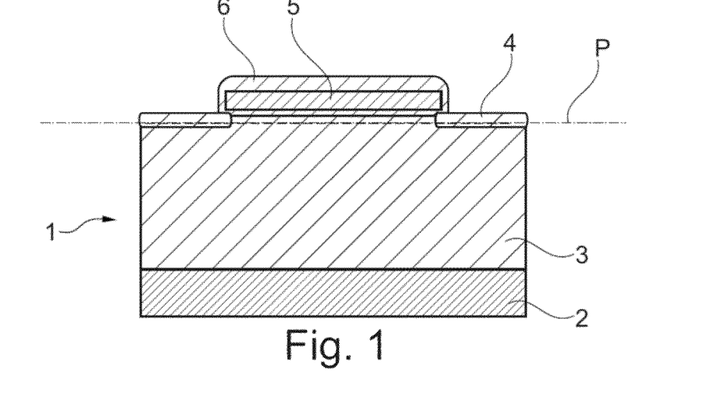
FIGS. 1 and 2 schematically show sectional views of a MOSFET according to the prior art.

The MOSFET according to the prior art in FIG. 1 comprises an electrode 2, a base layer 3 being arranged on the electrode 2, two contact layers 4 being arranged on the base layer 3, a gate contact 5 being arranged on the base layer 3, and an insulation layer 6 between the gate contact 5 and the base layer 3.

Figure 2:
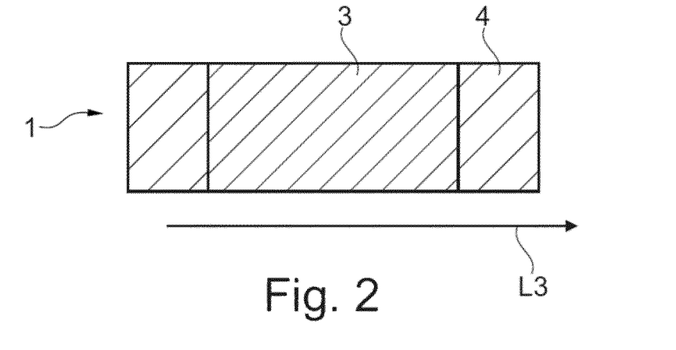

According to FIG. 2 a cross-section P, marked in FIG. 1, through the contact layers 4 and the base layer 3 is shown. Further, a main extension direction of the base layer L3 in lateral directions is depicted in FIG. 2.

Figure 3:
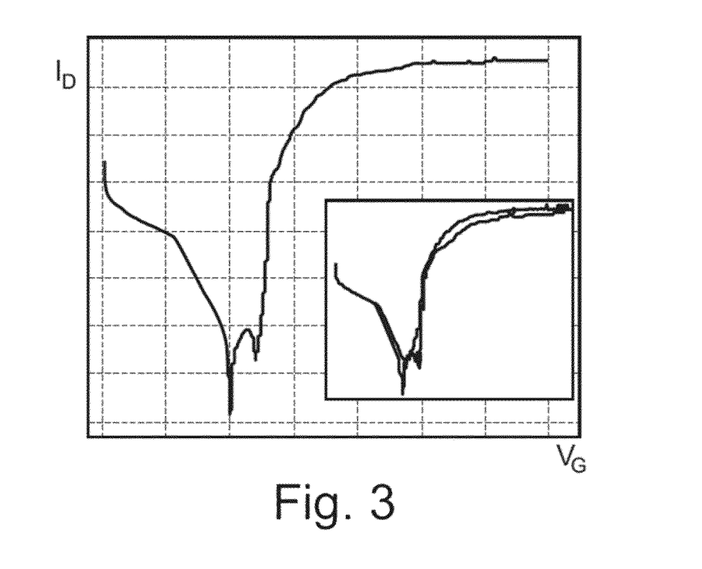
FIG. 3 schematically shows a current-voltage characteristic of a current for different gate voltages of a MOSFET according to the prior art.
Figure 4:
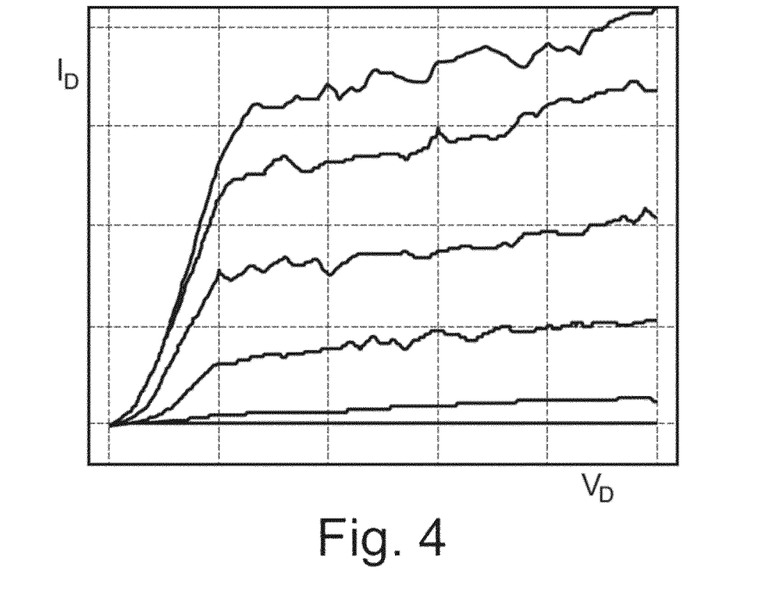
FIG. 4 schematically shows a current-voltage characteristic of a current for different voltages of a MOSFET according to the prior art.

The current-voltage characteristic of FIG. 3 shows a drain current Id for different gate voltages Vg of the MOSFET according to the prior art according to FIGS. 1 and 2.

Figure 5:
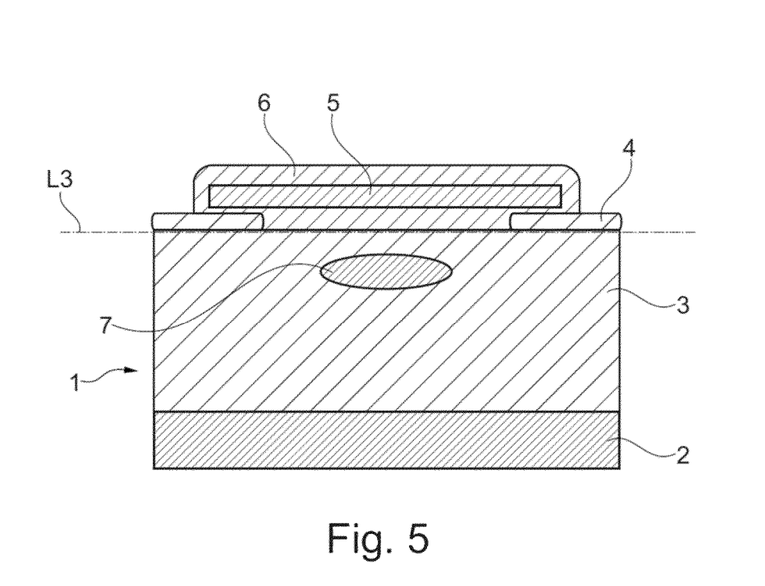
FIG. 5 schematically shows a sectional view of a power semiconductor device according to an embodiment.

The current-voltage characteristic of FIG. 5 shows a drain current Id for different drain voltages Vd of the MOSFET according to the prior art according to FIGS. 1 and 2.

The power semiconductor device 1 according to the embodiment of FIG. 5 comprises an electrode 2 on which a base layer 3 of a first conductivity type is provided. A top surface of the base layer 3 is plain. On this plain top surface of the base layer 3, two contact layers 4, each being a metallic layer, are arranged. In a side view of the power semiconductor device 1, the metallic layers and the base layer 3 do not overlap with one another.

In addition, a gate contact 5 is provided on the base layer 3 and on the metallic layers. The gate contact 5 is enclosed by an insulation layer 6, except the region for externally contacting. The insulation layer 6 is arranged between the gate contact 5 and the base layer 3 as well as between the at least two metallic layers and the gate contact 5.

The gate contact 5 and the insulation layer 6 partially overlap in lateral directions with the metallic layers. An overlap of the gate contact 5 and the insulation layer 6 with each of the metallic layers is, for example, is at least 0.2 µm and at most 2 µm. Furthermore, a side surface of each of the metallic layers are completely covered by the insulation layer 6.

Moreover, a zone 7 of a second conductivity type is located within the base layer 3. In this sectional view an outer surface of the zone 7 is completely covered by the base layer 3 such that the zone 7 is completely enclosed by the base layer 3 in two dimensions. Further, the zone 7 is provided centred in lateral directions with respect to the gate contact 5. For example, a distance between the zone 7 and the insulation layer 6 is at most 1 µm.

For example, the base layer 3 of the first conductivity type comprises n-type dopants. In this case, the zone 7 of a second conductivity type comprises p-type dopants. Due to such an arrangement of the zone 7 of the second conductivity type, a peak electric field generated in the base layer 3 is shifted away from the insulation layer 6 between the gate contact 5 and the base layer 3.

Figure 6:
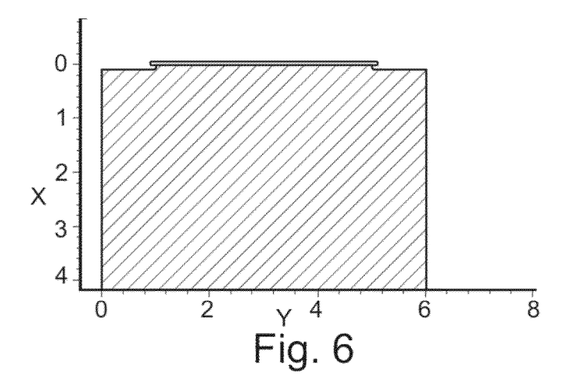
FIG. 6 schematically shows a doping profile of a MOSFET according to the prior art.

A simulation a doping profile according to FIG. 6 corresponds to a MOSFET according to FIGS. 1 and 2 without having a zone 7 of the second conductivity type.

Figure 7:
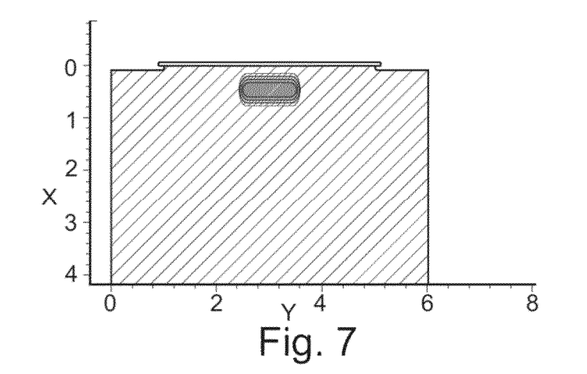
FIGS. 7 and 8 schematically shows a doping profile of a power semiconductor device according to an embodiment.
Figure 8:
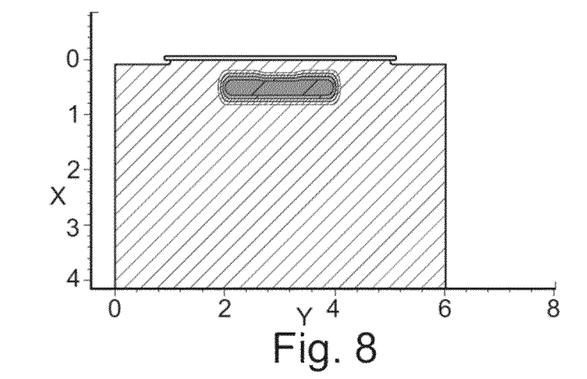

Simulations of doping profiles of the FIGS. 7 and 8 correspond to a power semiconductor device 1 with a zone 7 of a second conductivity type according to the embodiment of FIG. 5. In this cross sectional views, a doping concentration is represented by shaded areas. Here, shaded areas with a comparatively high density of lines corresponds to a comparatively high doping concentration. Consequently, shaded areas with a comparatively low density of lines corresponds to a comparatively low doping concentration. For example, the zone 7 of the second conductivity comprises a peak doping concentration being at least $10^{15}$1/$cm^3$ and at most $5\times10^{17}$ 1/$cm^3$ corresponding to the shaded area with the highest density of lines.

Figure 9:
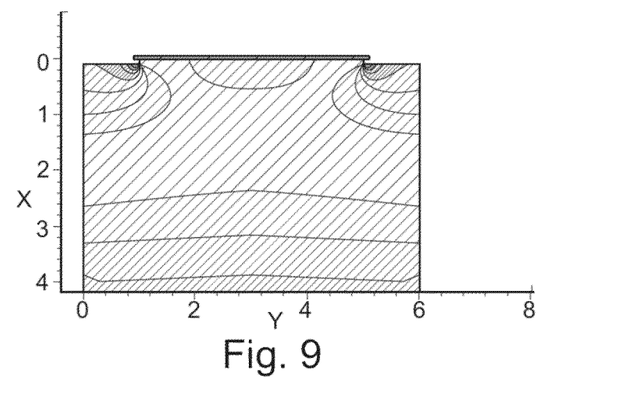
FIG. 9 schematically shows an electrical field profile of a MOSFET according to the prior art.

A simulation of an electric field profile according to FIG. 9 is based on the simulated doping profile according to FIG. 6. Here, an absolute value of an electric field in V/cm is about $1.7\times10^6$ V/cm directly below the gate contact 5 in a first region. An electric field of a second region, adjacent to the first region, is about $1.6\times10^6$ V/cm.

Figure 10:
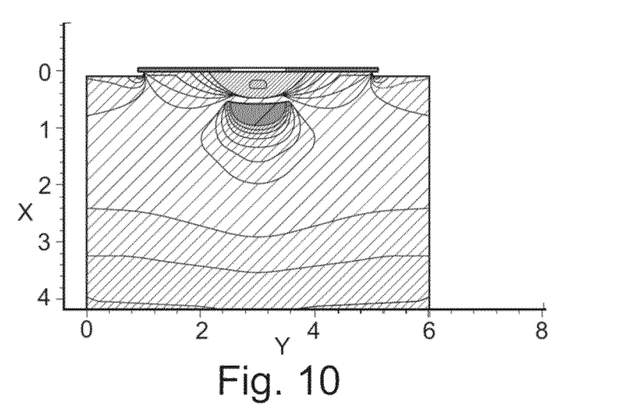
FIGS. 10 and 11 schematically shows an electrical field profile of a power semiconductor device according to an embodiment.
Figure 11:
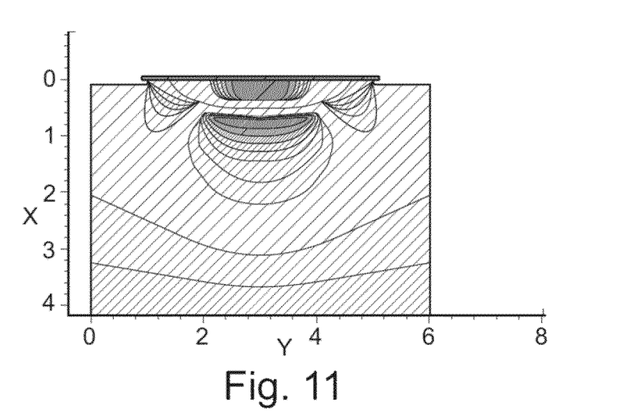

The simulations of an electric field profile according to FIGS. 10 and 11 are based on the doping profiles of FIGS. 7 and 8, respectively. An absolute value of an electric field directly below the gate contact 5 in a first region is reduced with respect to FIG. 9 to about $4\times10^5$ V/cm and in a second region to about $1\times10^6$ V/cm.

Figure 12:
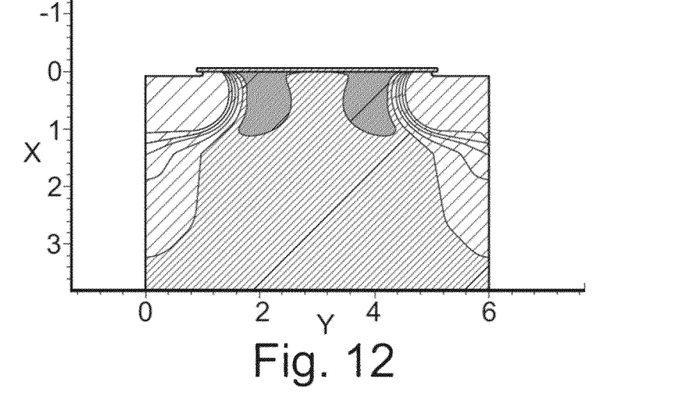
FIG. 12 schematically shows an electrical current density profile of a MOSFET according to the prior art.
Figure 13:
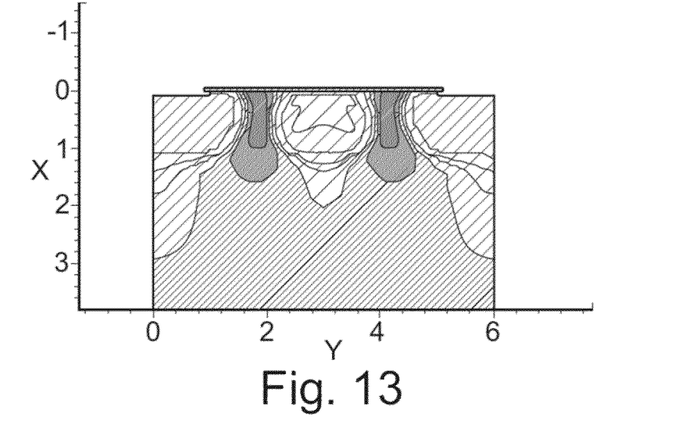
FIGS. 13 and 14 schematically shows an electrical current density profile of a power semiconductor device according to an embodiment.
Figure 14:
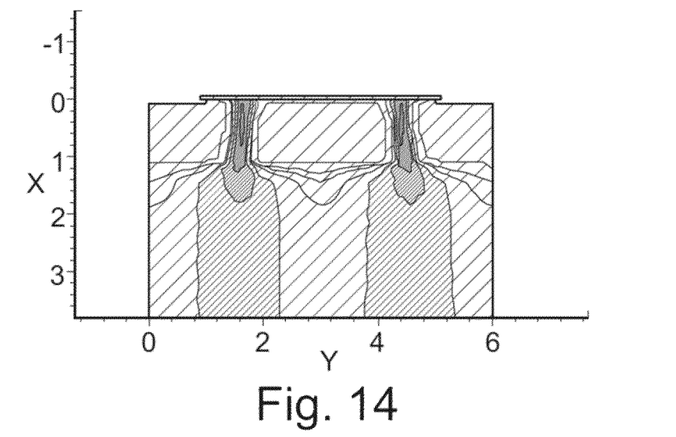

A simulation of an electric current density according to FIG. 12 is based on the simulated doping profile according to FIG. 6. The simulations of the electric current density according to FIGS. 13 and 14 are based on the doping profiles of FIGS. 7 and 8, respectively. The electric current density below directly below the gate contact 5 in a first region is less for the power semiconductor device 1 according to FIGS. 13 and 14. Here, a density of lines of shown shaded areas correspond to a value of the electric current density.

Figure 15:
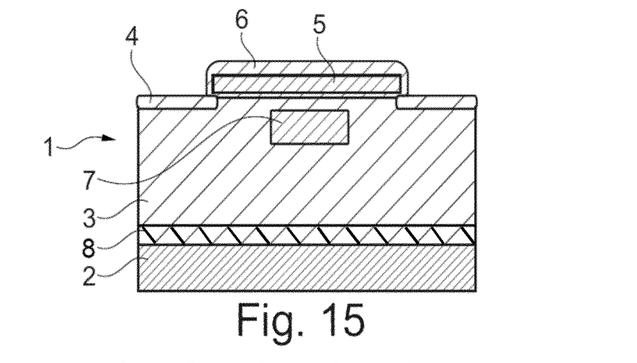
FIGS. 15 and 16 schematically show sectional views of a power semiconductor device according to an embodiment.
Figure 16:
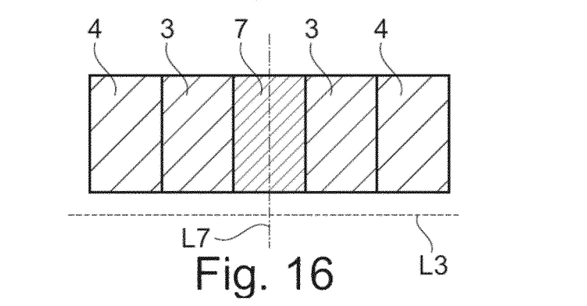

The base body of the power semiconductor device 1 according to the embodiment of FIGS. 15 and 16 comprise in contrast to the embodiment in connection with FIG. 5 a bar structure. The bar structure and the base body are formed in one piece. Due to the bar structure, the base body comprises two recessed top surfaces. On each of the two recessed top surfaces one contact layer 4 is arranged.

Furthermore, between the electrode 2 and the base layer 3, an injecting layer 8 of the second conductivity type is arranged. In this exemplary embodiment, the power semiconductor device 1 is an IGBT.

According to FIG. 16, showing a schematic top view on the power semiconductor device 1, the zone 7 has a main extension direction L7 in lateral directions being perpendicular to a main extension direction of the base layer L3. Furthermore, the zone 7 has a width in lateral directions along the main extension direction of the base layer L3, which is less than 40% of a length of the gate contact 5 in lateral directions along the main extension direction of the base layer L3.

The zone 7 being arranged centred between the two contact layers 4 in lateral directions extend along the main extension direction of the zone L7 over the whole width of the base layer 3 along the main extension direction of the zone L7.

Figure 17:
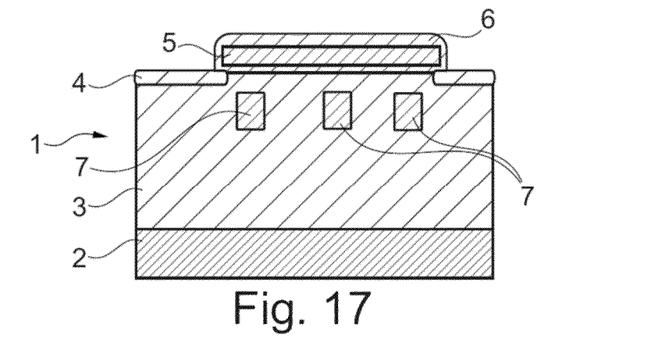
FIGS. 17 and 18 schematically show sectional views of a power semiconductor device according to an embodiment.
Figure 18:
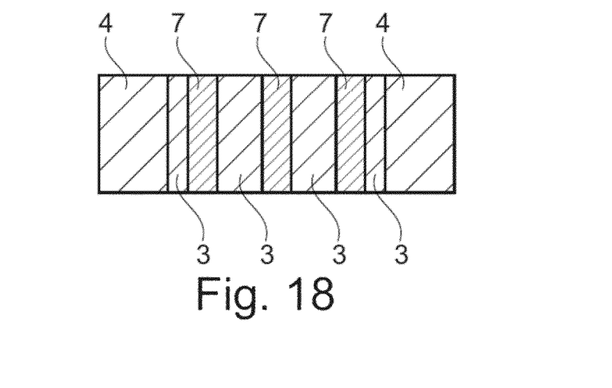

In contrast to the embodiment of FIGS. 15 and 16 the base layer 3 according to FIGS. 17 and 18 comprises three zones 7. The zones 7 are arranged spaced apart from one another. Furthermore, the main extension directions of the zones L7 are running parallel to one another. In this embodiment, the zones 7 are arranged in a common plane. This is to say that each zone 7 has a same minimal distant to the gate contact 5.

Figure 19:
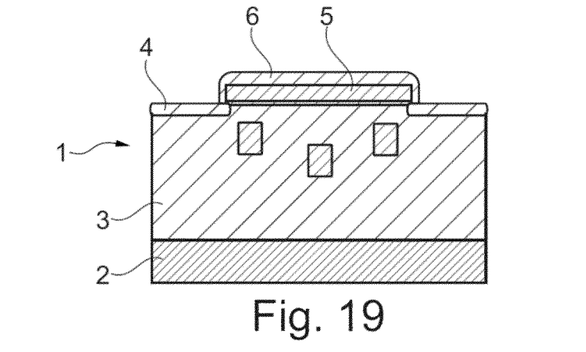
FIGS. 19 and 20 schematically show sectional views of a power semiconductor device according to an embodiment.
Figure 20:
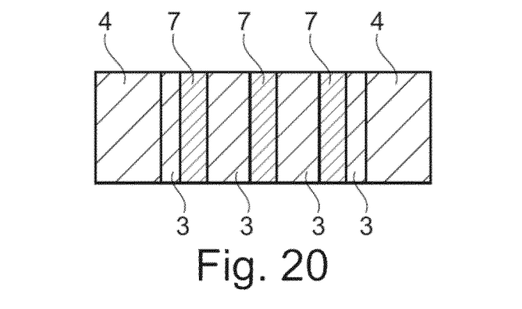

In contrast to the embodiment of FIGS. 17 and 18 the three zones 7 according to FIGS. 19 and 20 form a retrograde profile in a cross sectional view perpendicular to lateral directions. The retrograde profile comprises a peak facing away from the gate contact 5. The zone 7 in the middle of the three zones 7 has a minimal distance to the gate contact 5 in vertical direction than the outer two zones 7.

Figure 21:
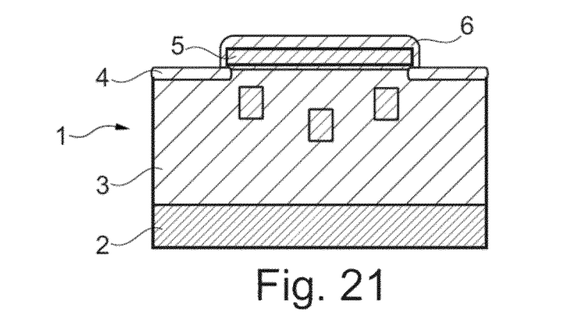
FIGS. 21 and 22 schematically show sectional views of a power semiconductor device according to an embodiment.
Figure 22:
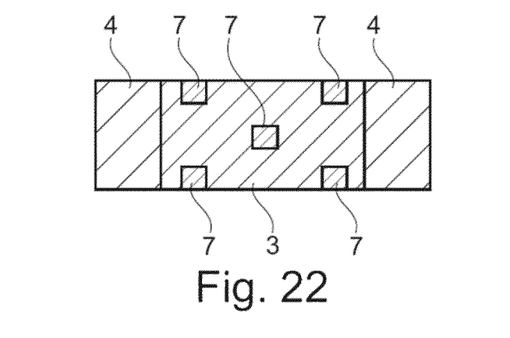

The power semiconductor device 1 according to the embodiment of FIGS. 21 and 22 comprises five zones 7. Each zone 7 does is formed of a square in plan view. In this embodiment, each zone 7 does not extend over the whole width of the base layer 3. Rather, each zones 7 forms a single pocket within the base layer 3 being completely, e.g. three dimensionally, surrounded by the base layer 3. One of the zones 7 is arranged in centred with respect to the gate contact 5 in lateral directions. Four of the five zones 7 are arranged symmetrically around the zone 7 arranged centred. These four zones 7 are arranged on grid points of a rectangular grid, e.g. in a box-like fashion.

Figure 23:
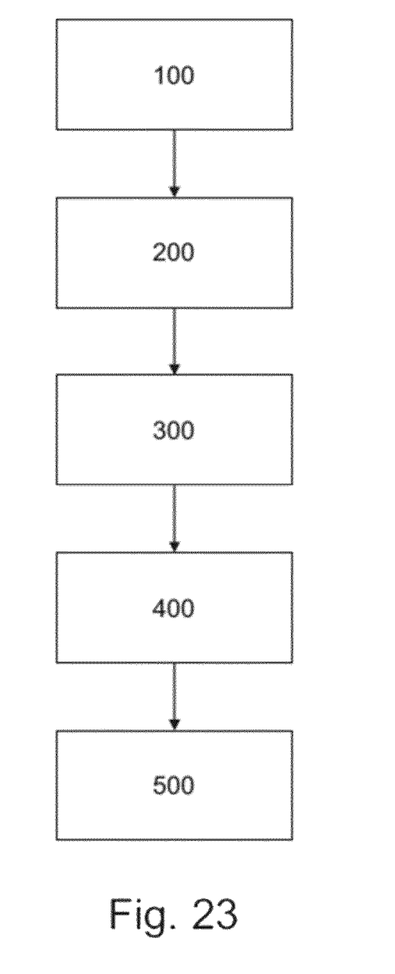
FIG. 23 shows a flow diagram of a method for producing power semiconductor device according to an embodiment.

In the method step 100, according to FIG. 23, an electrode 2 is provided and, in the method step 200, a base layer 3 of a first conductivity type is provided on the electrode 2.

Subsequently, in a next method step 300 at least two contact layers 4 are applied on the base layer 3. In a next method step 400, a gate contact 5 and an insulation layer 6 are applied on the base layer 3 and at least two contact layers 4, wherein the insulation layer 6 is applied between the gate contact 5 and the base layer 3 and between the at least two contact layers 4 and the gate contact 5

In the method step 500, at least one zone 7 of a second conductivity type is generated within the base layer 3, wherein the at least one zone 7 is constructed and arranged to shift away a peak electric field generated in the base layer 3 from the insulation layer 6 between the gate contact and the base layer 3.

LIST OF REFERENCE SYMBOLS 1 power semiconductor device
2 electrode
3 base layer
4 contact layer
5 gate contact
6 insulation layer
7 zone
8 injecting layer
L3 main extension direction of the base layer
L7 main extension direction of the zone
100 . . . 500 method steps

The invention claimed is:

1. A power semiconductor device comprising:
an electrode;
a base layer of a first conductivity type provided on the electrode;
at least one contact layer provided on the base layer;
a gate contact provided on the base layer and on the at least one contact layer;
an insulation layer between the gate contact and the base layer and between the at least one contact layer and the gate contact, and
at least one zone of a second conductivity type different from the first conductivity type within the base layer,
wherein the at least one contact layer is arranged on a top surface of the base layer, facing away from the electrode,
wherein the at least one contact layer is a metallic layer,
wherein an interface between the metallic layer and the base layer forms a Schottky contact,
wherein the at least one zone is embedded within the base layer such that an outer surface of the zone is completely covered by the base layer and such that the at least one zone is completely enclosed by the base layer in a three-dimensional manner,
wherein the at least one zone is provided centred in lateral directions with respect to the gate contact and a distance between the at least one zone and the insulation layer is at most 1 µm,
wherein the at least one zone comprises a peak doping concentration being at least $10^{15}$ 1/cm$^3$ and at most $5\times10^{17}$ 1/cm$^3$, and
wherein the at least one zone shifts away a peak electric field generated in the base layer from the insulation layer between the gate contact and the base layer.

2. The power semiconductor device according to claim 1, wherein the base layer comprises a plain top surface and the at least one metallic layer does not extend into the base layer in vertical direction, or the base layer comprises at least one recessed top surface and the at least one contact layer is provided on the at least one recessed top surface.

3. The power semiconductor device according to claim 1, wherein at least one of the gate contact and the insulation layer partially overlaps with the at least one contact layer in lateral directions.

4. The power semiconductor device according to claim 1, wherein an overlap of the at least one of the gate contact and the insulation layer in lateral directions with the at least one contact layer is at least 0.001 µm and at most 3 µm.

5. The power semiconductor device according to claim 1, wherein the at least one zone has a main extension direction in lateral directions transverse to a main extension direction of the base layer in lateral directions.

6. The power semiconductor device according to claim 5, wherein the at least one zone has a length in lateral directions being equal to a length of the at least one contact layer.

7. The power semiconductor device according to claim 1, wherein the at least one zone comprises a peak doping concentration being one to hundred times higher than a peak doping concentration of the base layer.

8. The power semiconductor device according to claim 1, wherein a thickness of the at least one zone is at least 0.1 µm and at most 1 µm.

9. The power semiconductor device according to claim 1, wherein the at least one zone has a width in lateral directions along a main extension direction of the base layer, which is less than 40% of a length of the gate contact in lateral directions along the main extension direction of the base layer.

10. A method for producing a power semiconductor device comprising:
providing an electrode;
providing a base layer of a first conductivity type on the electrode;
applying at least one contact layer on the base layer;
applying a gate contact and an insulation layer on the base layer and at least one contact layer,
wherein the insulation layer is applied between the gate contact and the base layer and between the at least one contact layer and the gate contact, and
generating at least one zone of a second conductivity type within the base layer,
wherein the at least one contact layer is arranged on a top surface of the base layer, facing away from the electrode,
wherein the at least one contact layer is a metallic layer,
wherein an interface between the metallic layer and the base layer forms a Schottky contact,
wherein the at least one zone is embedded within the base layer such that an outer surface of the zone is completely covered by the base layer and such that the at least one zone is completely enclosed by the base layer in a three-dimensional manner, wherein the at least one zone is provided centred in lateral directions with respect to the gate contact and a distance between the at least one zone and the insulation layer is at most 1 μm, wherein the at least one zone comprises a peak doping concentration being at least $10^{15}$ l/cm$^3$ and at most $5 \times 10^{17}$ l/cm$^3$, and the at least one zone shifts away a peak electric field generated in the base layer from the insulation layer between the gate contact and the base layer.

* * * * *